US008288214B2

United States Patent
Tredwell et al.

(10) Patent No.: US 8,288,214 B2
(45) Date of Patent: Oct. 16, 2012

(54) FLEXIBLE SUBSTRATE WITH ELECTRONIC DEVICES AND TRACES

(75) Inventors: Timothy J. Tredwell, Fairport, NY (US); Roger S. Kerr, Brockport, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/106,203

(22) Filed: May 12, 2011

(65) Prior Publication Data

US 2011/0212555 A1 Sep. 1, 2011

Related U.S. Application Data

(62) Division of application No. 11/538,173, filed on Oct. 3, 2006, now Pat. No. 7,977,170.

(51) Int. Cl.
| | |
|---|---|
| H01L 21/00 | (2006.01) |
| H01L 21/84 | (2006.01) |
| H01L 21/43 | (2006.01) |
| H01L 21/31 | (2006.01) |
| H01L 21/469 | (2006.01) |
| H01L 21/26 | (2006.01) |
| H01L 21/42 | (2006.01) |

(52) U.S. Cl. .......................... 438/151; 438/667; 438/780
(58) Field of Classification Search .................. 438/151, 438/667, 780; 257/E29.158
See application file for complete search history.

(56) References Cited

U.S. PATENT DOCUMENTS

| | | | |
|---|---|---|---|
| 6,418,267 B1 * | 7/2002 | Lowry | 385/147 |
| 6,492,026 B1 | 12/2002 | Graff et al. | |
| 6,680,485 B1 | 1/2004 | Carey et al. | |
| 6,762,124 B2 | 7/2004 | Kian et al. | |
| 6,812,949 B1 | 11/2004 | Switzer et al. | |
| 6,943,056 B2 | 9/2005 | Nemoto | |
| 7,045,442 B2 | 5/2006 | Maruyama et al. | |
| 7,462,857 B2 | 12/2008 | Arai et al. | |
| 7,678,701 B2 | 3/2010 | Tredwell et al. | |
| 2003/0117369 A1 * | 6/2003 | Spitzer et al. | 345/156 |
| 2005/0163968 A1 | 7/2005 | Hanket | |
| 2005/0210672 A1 * | 9/2005 | Reynolds et al. | 29/830 |
| 2006/0154041 A1 | 7/2006 | Hashimoto et al. | |
| 2006/0214169 A1 | 9/2006 | Funkhouser | |
| 2007/0042168 A1 | 2/2007 | Harada et al. | |
| 2007/0063939 A1 | 3/2007 | Bellamy | |
| 2007/0117485 A1 | 5/2007 | Sakata et al. | |
| 2010/0136777 A1 | 6/2010 | Tredwell et al. | |

* cited by examiner

*Primary Examiner* — William M. Brewster
(74) *Attorney, Agent, or Firm* — Nelson Adrian Blish

(57) ABSTRACT

A method of manufacturing an electronic device (10) provides a substrate (20) that has a plastic material and has a metallic coating on one surface. A portion of the metallic coating is etched to form a patterned metallic coating. A particulate material (16) is embedded in at least one surface of the substrate. A layer of thin-film semiconductor material is deposited onto the substrate (20).

11 Claims, 14 Drawing Sheets

FLEXIBLE SUBSTRATE WITH ELECTRONIC DEVICES AND TRACES

CROSS REFERENCE TO RELATED APPLICATIONS

This application is a divisional of prior U.S. patent application Ser. No. 11/538,173, filed Oct. 3, 2006, now U.S. Publication No. 2008/0090338 and U.S. Pat. No. 7,977,170, which is hereby incorporated herein by reference in its entirety.

FIELD OF THE INVENTION

This invention generally relates to electronic devices and more particularly relates to an electronic device and its interconnect traces fabricated on a flexible substrate.

BACKGROUND OF THE INVENTION

Thin-film transistor (TFT) devices are widely used in switching or driver circuitry for electro-optical arrays and display panels. TFT devices are conventionally fabricated on rigid substrates, typically glass or silicon, using a well-known sequence of deposition, patterning and etching steps. For example, amorphous silicon TFT devices require deposition, patterning, and etching of metals, such as aluminum, chromium or molybdenum, of amorphous silicon semiconductors, and of insulators, such as SiO2 or Si3N4 onto a substrate. The semiconductor thin-film is formed in layers having typical thicknesses of from several nm to several hundred nm, with intermediary layers having thicknesses on the order of a few microns, and may be formed over an insulating surface that lies atop the rigid substrate.

The requirement for a rigid substrate is based largely on the demands of the fabrication process itself. Thermal characteristics are of particular importance, since TFT devices are fabricated at relatively high temperatures. Thus, the range of substrate materials that have been used successfully is somewhat limited, generally to glass, quartz, or other rigid, silicon-based materials.

TFT devices can be formed on some types of metal foil and plastic substrates, allowing some measure of flexibility in their fabrication. However, problems such as chemical incompatibility between the substrate and TFT materials, thermal expansion mismatch between substrate and device layers, planarity and surface morphology, and capacitive coupling or possible shorting make metal foil substrates less desirable in many applications.

Clearly, there would be advantages in improving and expanding the range of suitable substrate materials for electronic devices such as TFTs to include more types of plastics and plastic materials with improved characteristics. This would allow fabrication on a flexible substrate and help to reduce the overall weight of display and other electro-optic components. It could be feasible to fabricate thinner devices. In addition, this capability could enable fabrication of larger displays and devices, since crystalline silicon and many types of glass that are conventionally employed as substrates become increasingly difficult to form and manage in large sheets.

While there are clear advantages to plastic and other flexible substrates, there are significant disadvantages that have discouraged use of such substrates, including the following:
Incompatibility with the high temperature range required for TFT fabrication.
Poor dimensional stability at high temperatures.
Mismatch of coefficient of thermal expansion (CTE) of plastic and thin-film semiconductor materials.
High moisture absorption characteristics of plastics.
Poor transparency for many types of plastic.
The requirement to attach and detach the plastic substrate material from a carrier.

Chief among these disadvantages are temperature-related requirements. The fabrication process for the TFT may require temperatures in the range of 200-300 degrees C. or higher, including temperatures at levels where many types of plastic substrates would be unusable. Thus, it is widely held, as is stated in U.S. Pat. No. 7,045,442 (Maruyama et al.), that a TFT cannot be directly formed on a plastic substrate. In order to provide the benefits of TFT devices mounted on a plastic substrate, the Maruyama et al. '442 disclosure describes a method that forms the TFT on a release layer that is initially attached to a carrier substrate. Once the TFT circuitry is fabricated, the release layer is then separated from its carrier substrate and can be laminated onto a lighter and more flexible plastic material.

As one alternative solution, U.S. Pat. No. 6,492,026 (Graff et al.) discloses the use of flexible plastic substrates having relatively high glass transition temperatures Tg, typically above 120 degrees C. However, the capability for these substrates to withstand conventional TFT fabrication temperatures much above this range is questionable. Moreover, in order to use these plastics, considerable effort is expended in protecting the substrate and the device(s) formed from scratch damage and moisture permeation, such as using multiple barrier layers.

Another alternative solution is described in U.S. Pat. No. 6,680,485 (Carey et al.) In the method described in the Carey et al. '485 disclosure, energy from a pulsed laser source is used to form amorphous and polycrystalline channel silicon TFTs onto low-temperature plastic substrates. The conventional, low-temperature plastic substrates for which this method is described include polyethylene terephthalate (PET), polyethersulfone (PES), and high density polyethylene (HDPE), for example.

Similarly, U.S. Pat. No. 6,762,124 (Kian et al.) discloses a process using an excimer laser to ablate a material through a mask to form a patterned conductor or semiconductor material for TFT formation onto a substrate. In the Kian et al. '124 disclosure, the substrate that is used is a composite, "glass replacement" material that may have a flexible or rigid plastic material supplemented with one or more barrier and protective layers.

Although these and similar solutions have been proposed for forming TFT components on flexible substrates, drawbacks remain. Lamination of a release layer that is populated with TFT devices, as described in Maruyama et al. '442 requires additional fabrication steps and materials and presents inherent alignment difficulties. The use of high-performance plastics, such as that of the Graff et al. '026 disclosure, still leaves thermal expansion (CTE) difficulties and requires additional layers and processes in order to protect the plastic. The excimer layer solutions proposed in the Carey et al. '485 and Kian et al. '124 disclosures do not provide the full breadth of capabilities of more conventional TFT fabrication techniques and thus have limited utility. None of these disclosures provide a flexible substrate that truly serves to replace glass or other silicon-based substrate, since the TFT must be formed either on a release layer or on some intermediate layer that must be formed on top of the flexible substrate.

One particular flexible material of interest for use as a substrate, with properties including dimensional stability and heat and chemical resistance, is the class of polyimides. However, even with its advantages, polyimide material presents significant obstacles to direct deposition of TFTs. For example, additional release layers and transfer layers must be employed, since reflow behavior is not characteristic of polyimides. The CTE of polyimide differs from that of thin-film semiconductor materials, leading to fracturing and electrical discontinuity following high-temperature fabrication. In one attempt to improve polyimide material characteristics, U.S. Patent Application Publication No. 2005/0163968 (Hanket) describes a micro-filled polyimide film having improved CTE and other durability enhancements. However, even where CTE can be more closely matched using microfiller additives, other problems with lamination remain. Other plastics of interest, such as Teflon®, may have some properties that are more favorable for use as flexible substrates, but present other sets of obstacles that preclude their use with conventional fabrication approaches.

As part of the process of forming thin-film electronic components on a substrate, making connections between the various components further requires forming metal traces and interlayer vias that connect components to these traces. This process is familiar to those skilled in conventional PC board fabrication, in which a board is fabricated using sequential lamination of individual layers of dielectric and patterned or un-patterned metal lines. A PC board may contain as many as 20 layers. The individual layers contain a dielectric, such as glass-filled Teflon, phenolic or polyimide, on which metal, typically 5-20 microns of copper, aluminum, gold or silver has been plated. The metallization on the each of the layers is typically patterned by coating photoresist, exposing to a photo-mask, developing the photoresist, and etching the metallization, leaving patterned traces. Vias, formed by laser-drilling holes in the substrate or by photolithography, may be formed to allow interconnection between layers.

Conventional semiconductor circuits or devices can be attached to the PC board in several ways:

- Attachment of fabricated semiconductor die directly onto the substrate (chip on board) with wire-bonding or flip-chip ball bonding of the die to the top layer of metal traces on the PC board;
- Packaging semiconductor die in plastic or ceramic packages which contain solder balls, following by attachment of the packages to the substrate; or
- Packaging the semiconductor die in a plastic or ceramic packages that contain metal leads, which are then inserted into holes or tab-bonded to the PC board.

While these approaches are well known for use with multi-layer PC boards, however, additional steps would be necessary to attach semiconductor devices to a flexible substrate instead of the conventional PC board material.

It can, therefore, be appreciated that there is an unmet need for a fabrication method for forming TFTs directly onto a flexible substrate with a minimum number of additional steps and procedures for preparation or conditioning of the substrate itself and for forming interconnect traces and vias on the same substrate.

SUMMARY OF THE INVENTION

It is an object of the present invention to provide a method of manufacturing an electronic device comprising:
a) providing a substrate that comprises at least one plastic material;
b) embedding a particulate material in at least one surface of the substrate; and
c) forming a thin film electronic device on the surface with the particulate material.

It is a feature of the present invention that it provides an electronic device fabricated onto a flexible substrate. The flexible substrate can include polytetrafluoroethylene (PTFE) or Teflon®, which allows reflow and therefore minimizes or eliminates the need for intermediate lamination materials. The present invention also makes it possible to fabricate electronic devices onto thinner substrates.

It is another advantage of the present invention that it provides a plastic substrate that can offer improved lamination, including self-lamination to a carrier.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Figures given in this application are representative of overall spatial relationships and arrangement of layers for deposition onto a substrate and may not be drawn to scale.

Figure 1:
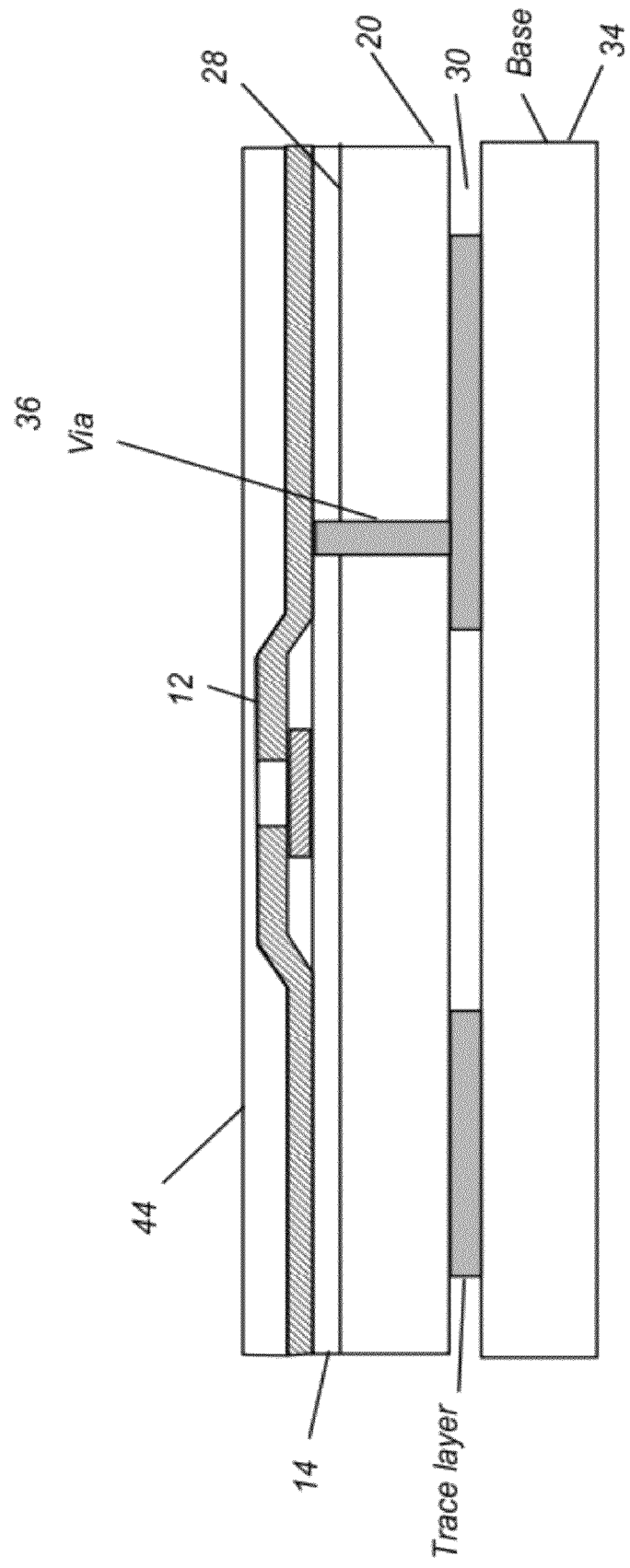
FIG. 1 is a cross-sectional view showing an electronic circuit formed on a flexible substrate with metal traces using the method of the present invention.

Referring to FIG. 1, there is shown an electronic device 10 formed according to the present invention. A thin-film component 12, such as a conductor, a thin-film transistor, a diode, or other component, is formed onto one surface 28 of a flexible substrate 20 such as a plastic that is a composite material, consisting of one or more particulate bonding materials and one or more plastic binders as is described subsequently. Composite substrate 20 is typically attached to a carrier, such as a glass sheet, during fabrication processing, but is shown as a finished product in FIG. 1. One or more layers 14 may be formed for providing electrical isolation and planarization or smoothness and for providing a suitable surface for forming thin-film devices onto surface 28. In one embodiment, layer 14 is silicon nitride, used both to seal and insulate the surface to allow thin film deposition. In another embodiment, a supplemental layer of benzocyclobutene (BCB) or spun-on glass (SOG) is used for planarization. When used in this way, layer 14 is conventionally referred to as a type of planarization layer.

Figure 2:
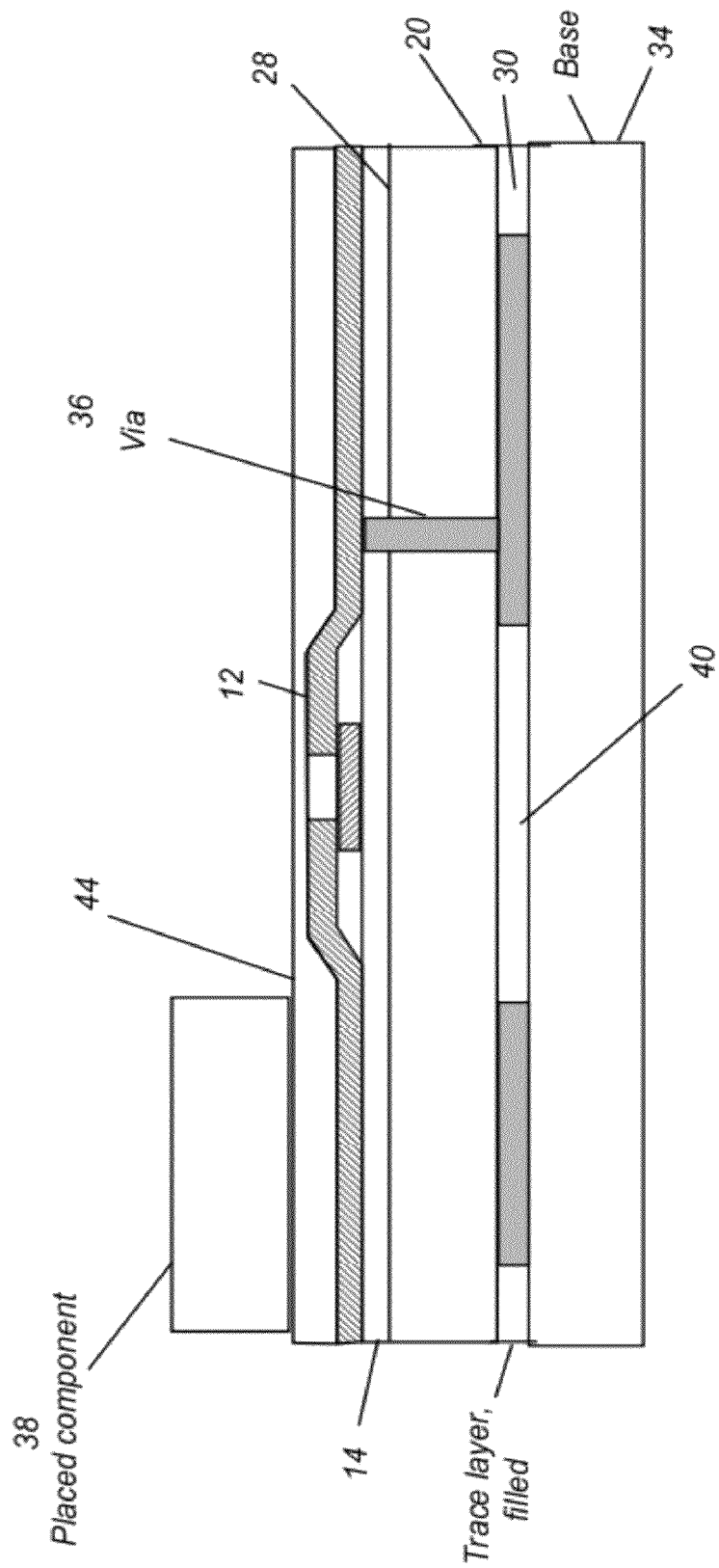
FIG. 2 is a cross-sectional view showing an electronic circuit formed on a flexible substrate according to the present invention and having an added semiconductor component.

A trace layer 30 is formed on an opposite surface (not shown) of substrate 20, by etching a pattern into a metallic coating that is deposited onto or adhered to opposite surface. An optional base layer 34, also of a flexible plastic, may also be provided. One or more vias 36 can be formed for interconnecting thin-film components 12 using patterned traces on trace layer 30. As is shown in the cross-sectional of FIG. 2, one or more placed components 38, such as a conventional semiconductor component formed using silicon or some other semiconductor base material, may also be used as part of an electronic circuit with this arrangement. Trace layer 30 may or may not have an additional filler 40 between patterned traces, as indicated in FIG. 2. An optional protective layer 44, typically for insulation and planarization, can also be provided.

Figure 3:
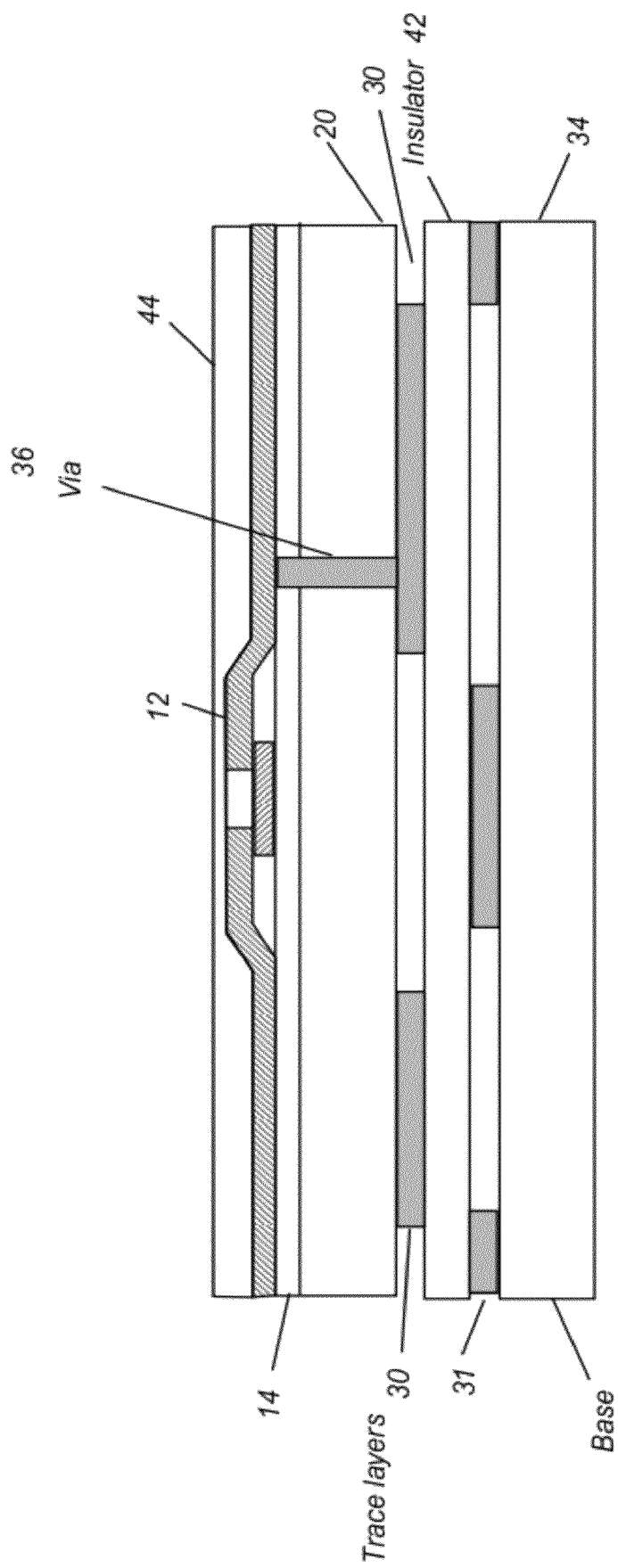
FIG. 3 is a cross-sectional view showing an electronic circuit formed on a flexible substrate with metal traces in multiple layers using the method of the present invention.

The cross-sectional view of FIG. 3 shows another embodiment having multiple trace layers 30 and 31. Between the two trace layers 30 and 31 is an insulator 42. One of trace layers 30, 31 could provide power or ground connection; the other might provide signal connection between components. Additional patterned layers could also provide electromagnetic interference (EMI) shielding, as needed.

The present invention also relates to the co-optimization of a plastic binder, with a particulate material applied to at least one surface of a substrate, and carrier materials and processes for bonding device layers to a flexible substrate and minimizing stress within the substrate.

As the term is used in the present description, "plastic" refers to a material having a high polymer content, usually made from polymeric synthetic resins, which may be combined with other ingredients, such as curing agents, fillers, reinforcing agents, colorants, and plasticizers. A "resin" is a synthetic or naturally occurring polymer. Plastic is solid in its finished state, and at some stage during its manufacture or processing into finished articles, can be shaped by flow. Plastics are typically formed using a curing process, in which a solvent is evaporated at a suitable rate. Plastic includes thermoplastic materials and thermosetting materials. The term "flexible" refers generally to sheet materials that are thinner than about 1 mm and that exhibit a modulus of elasticity E of plastic, which is typically between about 100,000-500,000 psi.

Figure 4:
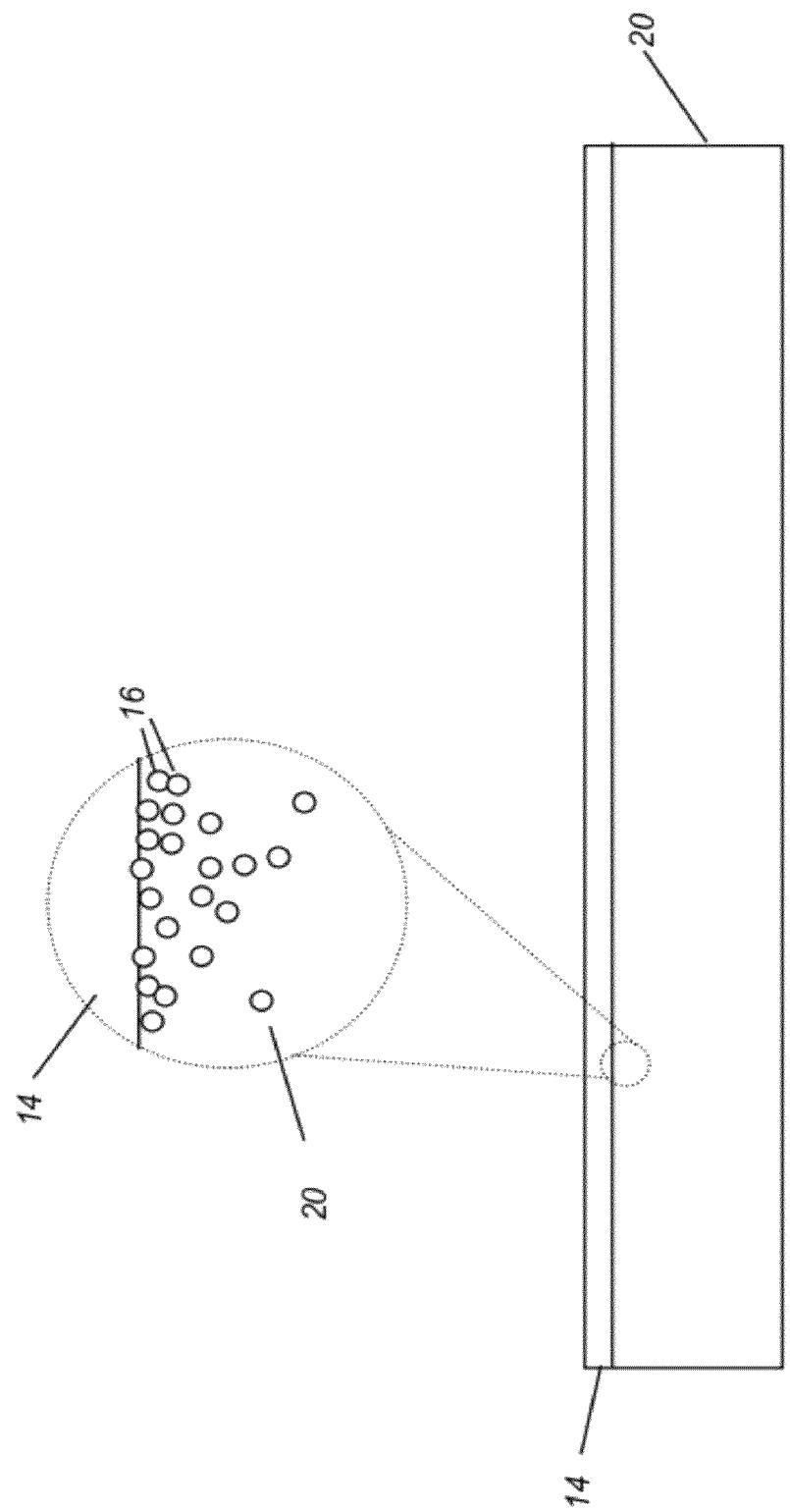
FIG. 4 is a cross-sectional view showing a magnified portion of the composite substrate of the present invention.

In order to support fabrication of electronic device 10 as shown in FIG. 1, 2 or 3, substrate 20 has a characteristic formulation, consisting of a suitable plastic binder and conditioned with a particulate material impregnated near or on surface 28. Referring to FIG. 4, the structural arrangement of composite substrate 20 for one embodiment is represented in a magnified view. A particulate material 16 is added to the base plastic composition of substrate 20, which acts as a binder with respect to the particulate. Particulate material 16 is a solid particulate of some type, suitably selected both to enable bonding to layer 14 so that layer 14 can provide insulation, passivization, or smoothing, and to modify the CTE of the plastic material itself. With the addition of particulate material 16 near the surface, it is now possible to fabricate TFT and other thin-film devices onto substrates such as PTFE that were previously not compatible with thin-film deposition. This conditioning of the surface of substrate 20 thus allows fabrication of electronic devices and their related connection traces and other components on a flexible substrate. Composite substrate 20, when fabricated in this way, is capable of withstanding high temperatures and is resilient to various types of etchants and processes required for TFT formation. This type of treatment can be used on either one or both surfaces of flexible substrate 20 and may be thus used to provide a more suitable bond not only for TFT fabrication but also for forming patterned traces.

Plastic Material

By adding an appropriate particulate material 16 to a plastic, as is described subsequently, the method of the present invention allows an expanded list of plastic materials to be used for flexible substrates. Exemplary binder plastic materials include, but would not be limited to, heat-stabilized polyethylene terephthalate (HS-PET). A number of other plastic substrates can be used as binder, such as polyethylenenapthalate (PEN), polycarbonate (PC), polyarylate (PAR), polyetherimide (PEI), polyethersulphone (PES), polyimide (PI), Teflon® poly(perfluoro-alboxy) fluoropolymer (PFA), poly(ether ether ketone) (PEEK), poly(ether ketone) (PEK), poly(ethylene tetrafluoroethylene)fluoropolymer (PETFE), and poly(methyl methacrylate) and various acrylate/methacrylate copolymers (PMMA). Suitable plastics for use as binder may include various cyclic polyolefins, ARTON fabricated by JSR Corporation, Zeonor made by Zeon Chemicals L.P., and Topas made by Celanese AG. Other lower-temperature plastic substrates can also be used, including: ethylene-chlorotrifluoro ethylene (E-CTFE), marketed as HALAR from Ausimont U.S.A., Inc., ethylene-tetra-fluoroethylene (E-TFE) sold under the trademark TEFZEL by Dupont Corporation, poly-tetrafluoro-ethylene (PTFE), fiber glass enhanced plastic (FEP), and high density polyethylene (HDPE). Transparent plastics would be highly advantaged in some applications.

With added particulate material 16, certain of these plastic substrates can withstand higher processing temperatures of up to at least about 200 degrees C., with some capable of withstanding temperatures of 300 degrees C. or higher without damage.

Plastic binder materials of special interest include polyimide, as noted earlier, and polytetrafluoroethylene (PTFE) or poly(perfluoro-alboxy)fluoropolymer (PFA), known commercially as Teflon®, sold by DuPont, Inc. As noted earlier, neither polyimide nor PTFE, as conventionally formed, are inherently well-suited as substrates for TFT deposition, although a number of different surface treatments have shown limited success. However, when these materials are treated according to the present invention, they can provide flexible substrates having highly favorable characteristics for supporting TFT circuitry.

In yet other embodiments, compositions that include one or more of these plastic materials may be a preferred solution. For example, it can be advantageous to combine a polyimide with polytetrafluoroethylene (PTFE) or poly(perfluoro-alboxy)fluoropolymer (PFA) in order to obtain the more favorable properties of both plastics.

Characteristics of Particulate Material

Suitable particulate materials 16 include glass including spun-on glass, carbon, fibers, metal fibers, and plastics. Particulate materials 16 could also be woven materials or fibers, such as woven fiberglass, for example. Particulate materials 16 may have a range of structural properties and shapes. Particulate materials 16 may be particles of roughly spherical shape, platelets of dimension smaller than, or exceeding, the thickness of the substrate. Particulate materials 16 could be elongated in shape, including wires, rods, or fibers for example. Ceramic fillers or other dielectric materials could be used as particulate materials 16.

The angular orientation of particulate material 16 within the plastic binder material can also be varied. For example, elongated particulate materials 16 could be dimensionally aligned, such as in a single direction or in layers of alternating directions, or aligned along two or more axes in a plane. Particulate materials 16 can be oriented in a specific direction or pattern with respect to the surface of substrate 20, which may affect anisotropic optical, electronic, thermal, magnetic, chemical or physical properties. As just one example, fibers of particulate material 16 within the binder could be vertically oriented in order to guide light or heat in a vertical direction. Alternately, laterally oriented optical fibers could be used to guide light through composite substrate 20 in other directions.

Inorganic materials can be introduced as particulate materials 16 in order to modify a number of properties, such as the following:
  Selected optical properties, such as color or light scattering;
  Selected electronic properties, such as carbon filling for conductivity or electrical shielding;
  Selected thermal properties, such as metal particle filling to improve thermal conductivity;
  Selected magnetic properties, with magnetic materials including ferromagnetic materials utilized for magnetic attachment or for data storage;
  Chemical properties, such as resistance to process chemistries, or physical properties, such as CTE, tensile strength, compressive strength, modulus, or flexibility; or
  Radiation properties, such as radiation shielding or energy-selective X-ray transmission or absorption.

One important result of the combination of particulate material 16 with plastic binder material according to the present invention relates to improved coefficient of thermal expansion (CTE). It has been found that the CTE of the composite substrate more closely approximates the CTE of device layers for TFT devices than it approximates the CTE of the plastic binder. Thus, the CTE of the composite substrate more closely approximates the CTE of glass or silicon carriers 18 that are conventionally used for device fabrication. As a result, less stress is introduced in the device layers during device fabrication, improving device performance, dimensional stability, and reliability. This also minimizes the likelihood of delamination, in which the TFT device would be separated from is substrate.

The addition of inorganic particulate materials such as glass or ceramic as particulate material 16 also has a number of additional advantages, including:
  Adhesion of the TFT layers is improved because the particulate surface provides better adhesion than does the plastic binder alone.
  Improved temperature limits for device fabrication: the use of particulate material increases the temperature limits before loss of dimensional stability, allowing device fabrication at higher temperatures.
  In some combinations of materials, the particulate material may reduce the dielectric constant of the substrate, thereby advantageously reducing capacitance.

Transparent particulate materials 16 would be advantaged in many applications. Where light behavior is important, particulate materials 16 may be selected based on index of refraction $n_1$ relative to the index of refraction $n_2$ of the plastic binder material. Where their respective indices of refraction $n_1$ and $n_2$ are matched, or very nearly matched, optical scattering can be minimized. The closer the indices of refraction $n_1$ and $n_2$ are matched, the less scattering would result. Alternately, optical scattering may be desirable, in which case, increased difference between indices of refraction $n_1$ and $n_2$, such as by more than about 0.1 for example, causes correspondingly increased scattering. Opaque or reflective materials could be used. Light-absorbing colorants could be added to the plastic material as well as to particulate material 16 for absorbing stray light, adding color, or providing a filter for incoming or outgoing light. Similarly, planarization layer 14 could have a colorant.

Example 1

In one embodiment, the material used for composite substrate 20 is a PTFE woven fiberglass laminate, such as a material from the DiClad 522, 527 Series available from Arlon, Inc. Rancho Cucamonga, Calif. Dimensionally stable under temperature stress, PTFE woven fiberglass laminates have been used, for example, for printed circuit boards (PCBs) and, when used for this purpose, are supplied with a copper layer, typically an electrodeposited copper layer. For use as a flexible substrate 20, an ideal thickness for PTFE woven fiberglass laminate is in the range of about 25 microns to about 3000 microns.

Given this substrate, TFT fabrication processing is as follows:
  1. Mounting on carrier 18. The flexible substrate is initially laminated onto a glass carrier 18. This is done by positioning substrate 20 on carrier 18 and treating this combination by applying heat and pressure to achieve the flow temperature (Tg) of the PTFE material, approximately 300 degrees C. The PTFE material softens, reflows, and bonds to the surface of carrier 18.
  2. Surface treatment. This next step conditions or treats the surface of substrate 20 in order to provide a suitable base to allow adhesion of layer 14. In one embodiment, layer 14 is a planarization layer. Layer 14 may alternately be another preparatory material or may include materials used in forming the thin-film electronic device itself. This treatment is effected by embedding particulate material 16 into the substrate surface. As shown in FIG. 4, it is advantageous to add particulate material 16 nearest the surface of substrate 20. Particulate material 16 can be applied to the surface by numerous methods, including rolling, or dusting, for example. Particulate material 16 can alternately be applied by inkjet deposition, printing, transfer from an intermediate material, application using doctor-blade skiving techniques, such as in a solvent, sprinkling, or other methods. The plastic material can be heated to facilitate embedding of particulate material 16. Alternately, particulate material 16 can be added to the binder plastic material during curing processes. Still other methods for surface treatment are described subsequently.
  3. Planarization. The desired surface roughness for TFT deposition can be on the order of less than 0.2 to 0.3 microns peak-to-peak in some applications. In order to achieve this, spun-on glass (SOG) is deposited. To apply this substance, a sol of colloidal silica particles in a solvent is applied to the substrate 20 surface. Temperature at 300-400 degrees C. is applied to cure the sol material, removing solvent and leaving a gel residue that, when itself heated, converts to an $SiO_2$ film having dielectric constant $\in$ between about 3 and 5 and providing the necessary insulation and planarization needed prior to TFT deposition. Alternative planarization materials are described subsequently.

In addition to improvements in CTE matching and response, the method of the present invention also binds TFT components to the surface of substrate 20 in an improved manner. Particulate material 16 that lies near the surface or even extends slightly outward from the surface of composite substrate 20 provides binding surface area for layer 14, which may be an insulating silicon nitride or silicon oxide layer. Without particulate material 16, these silicon compounds would be unable to bond to the surface, seriously hampering the capability to fabricate a workable TFT device or other type of electronic device thereon.

4. Forming electrical isolation layer. As a final surface preparation step for conditioning the surface of the substrate, which may be optional, an electrical isolation layer is deposited on top of the planarization layer. A suitable isolation layer material can be SiO2, SiNx, SiON, or some combination of these materials. This is typically in the range from about 0.5 to 1.5 μm.

5. Forming TFT elements. Following preparation of the flexible substrate 20 surface, the lay-down of TFT elements can begin. This typically requires depositing a layer of thin-film semiconductor material onto the substrate, then forming a pattern by selective removal of portions of the semiconductor material. This procedure uses processes that are well known in the art of component fabrication for lay-down of gate, source, and drain components and other supporting layers.

6. Delamination from carrier 18. This may require application of heat at temperatures near the flow temperature of the substrate plastic material. This allows separation of substrate 20 from carrier 18. Once separated, substrate 20 can be laminated to some other surface or allowed to cool.

7. Patterning of interconnect traces on trace layer 30. In this step, conventional etching procedures, using photoresist or other masking methods along with light exposure and application of an etchant to remove metal from unexposed areas, can be used to form the needed pattern of interconnect traces.

8. Formation of vias 36. Plated vias 36 can be formed using conventional techniques for interconnecting PC board layers in this manner.

Following these basic steps, further processing can be used, such as to add protective layers or to provide connectors or other structures to electronic device 10. In one embodiment, for example, a protective coating of spun-on glass (SOG) is applied to both top and bottom surfaces of electronic device 10.

The method of Example 1 could be modified for specific substrate and component types. Other spin-coated dielectric treatments could alternately be used, for example.

Example 2

Figure 7A:
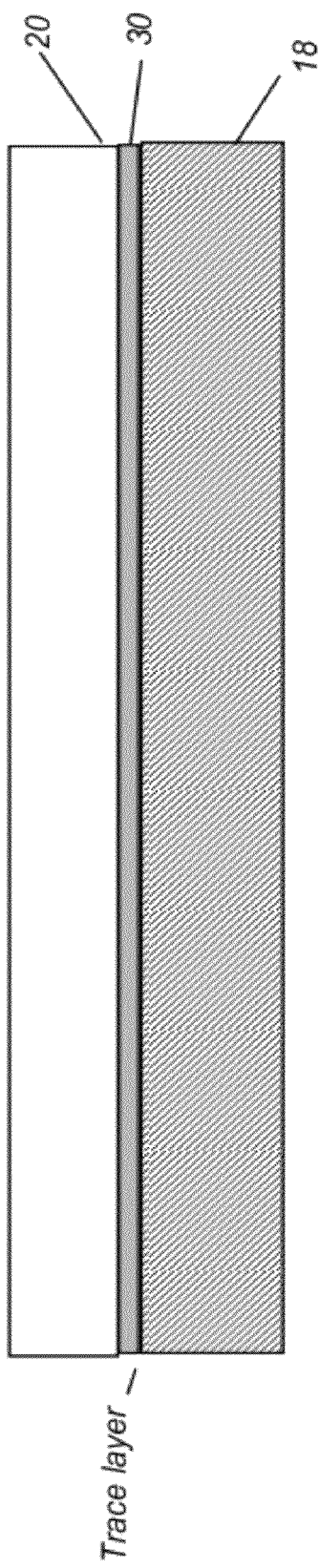
FIGS. 7A-7G show steps for electronic device fabrication according to one embodiment.
Figure 7B:
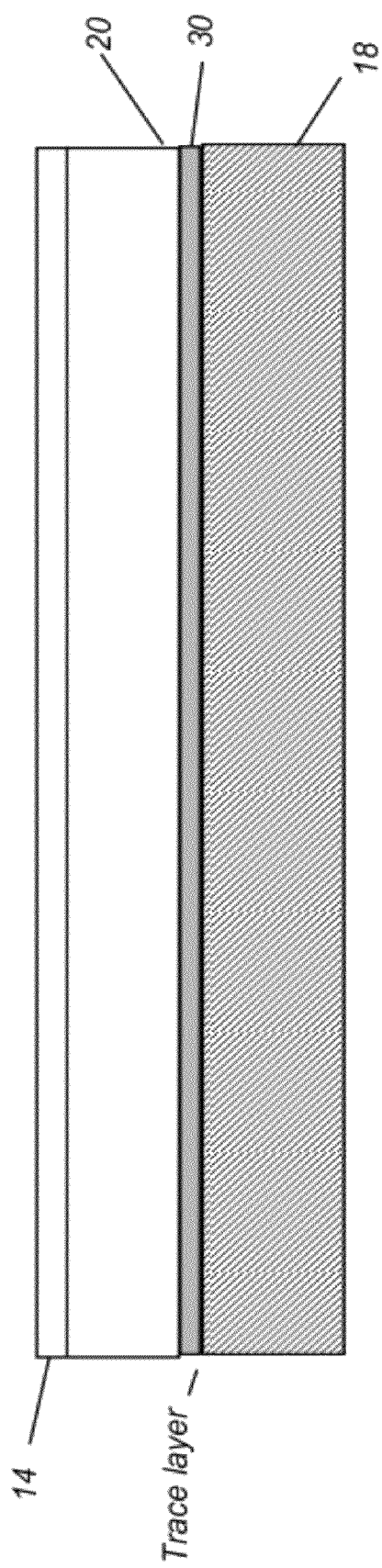
Figure 7C:
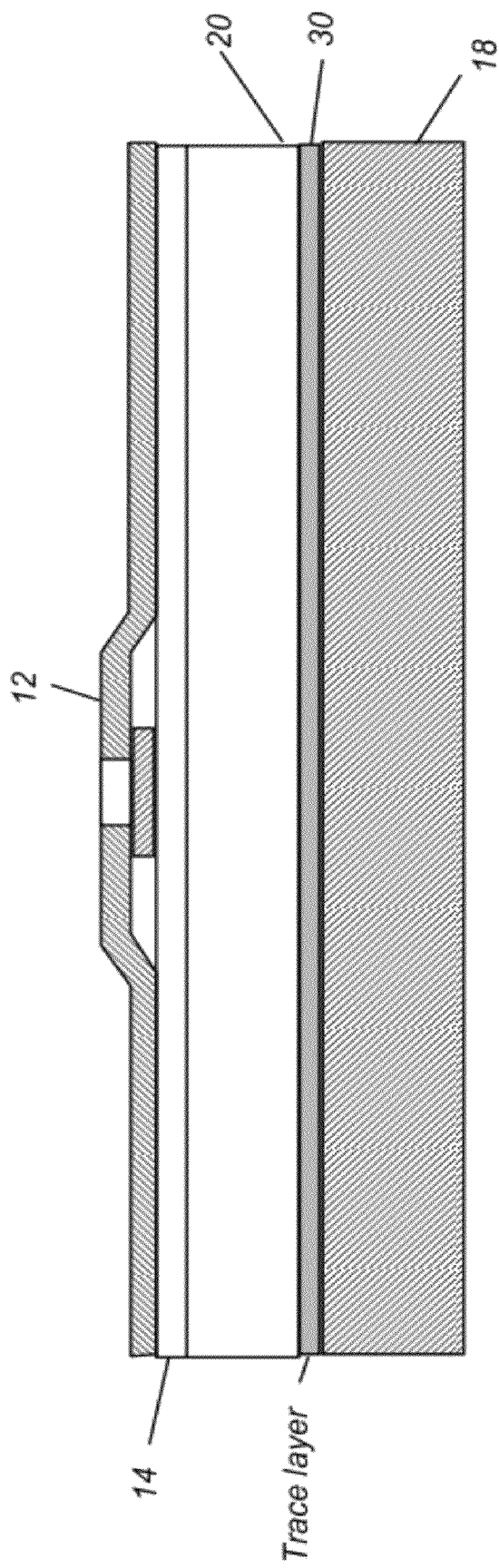
Figure 7D:
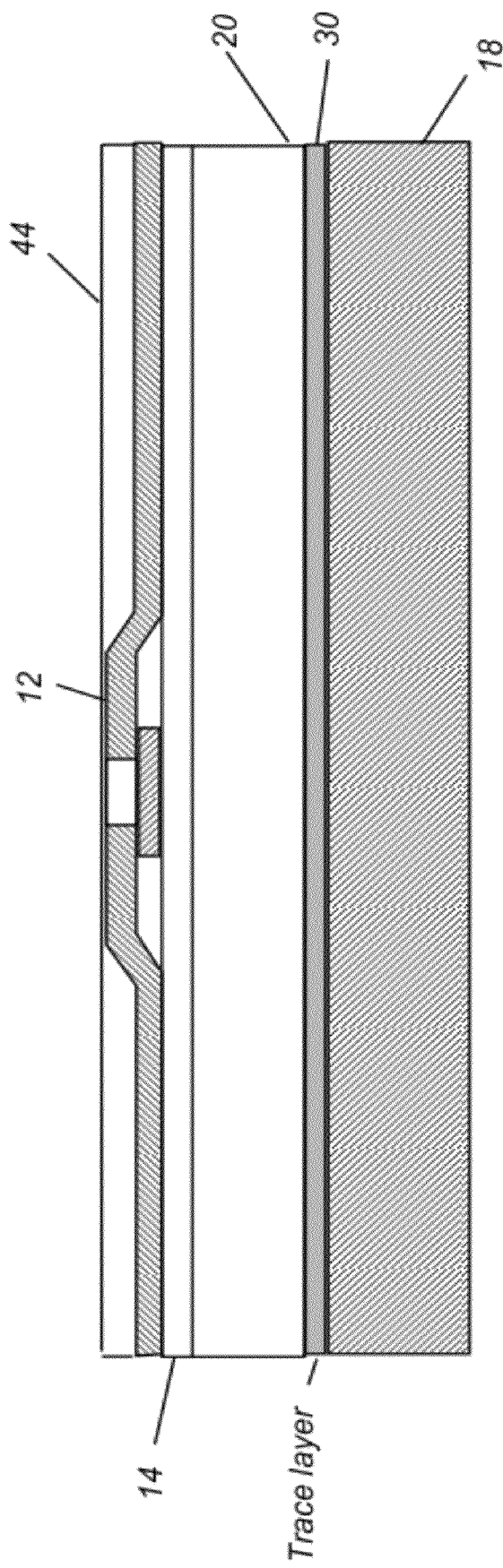
Figure 7E:
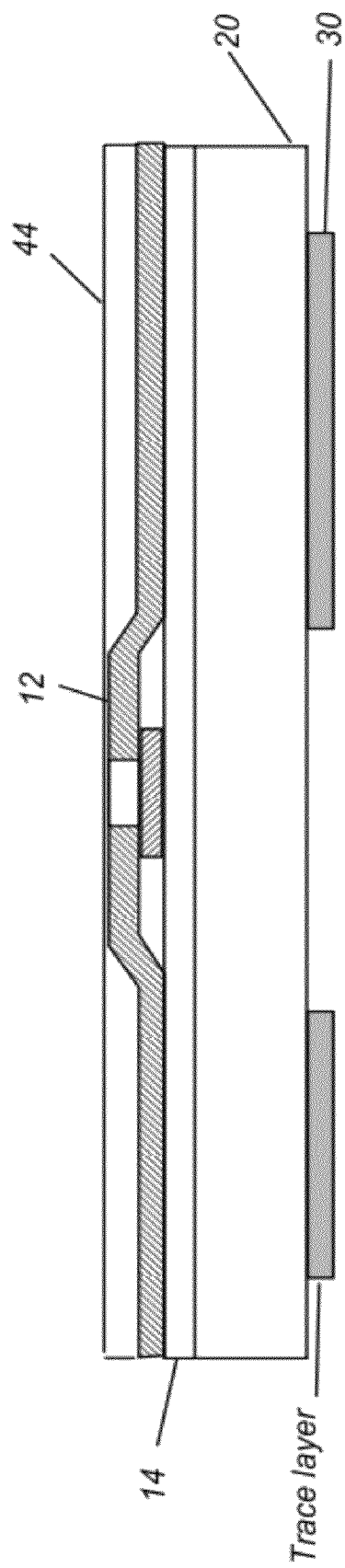
Figure 7F:
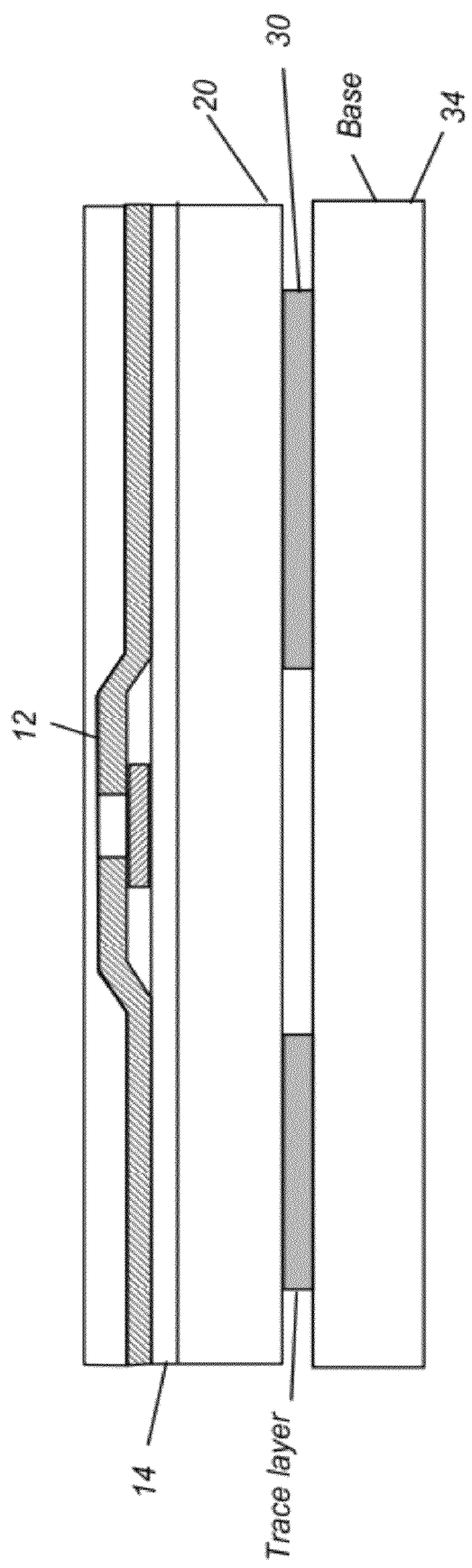
Figure 7G:
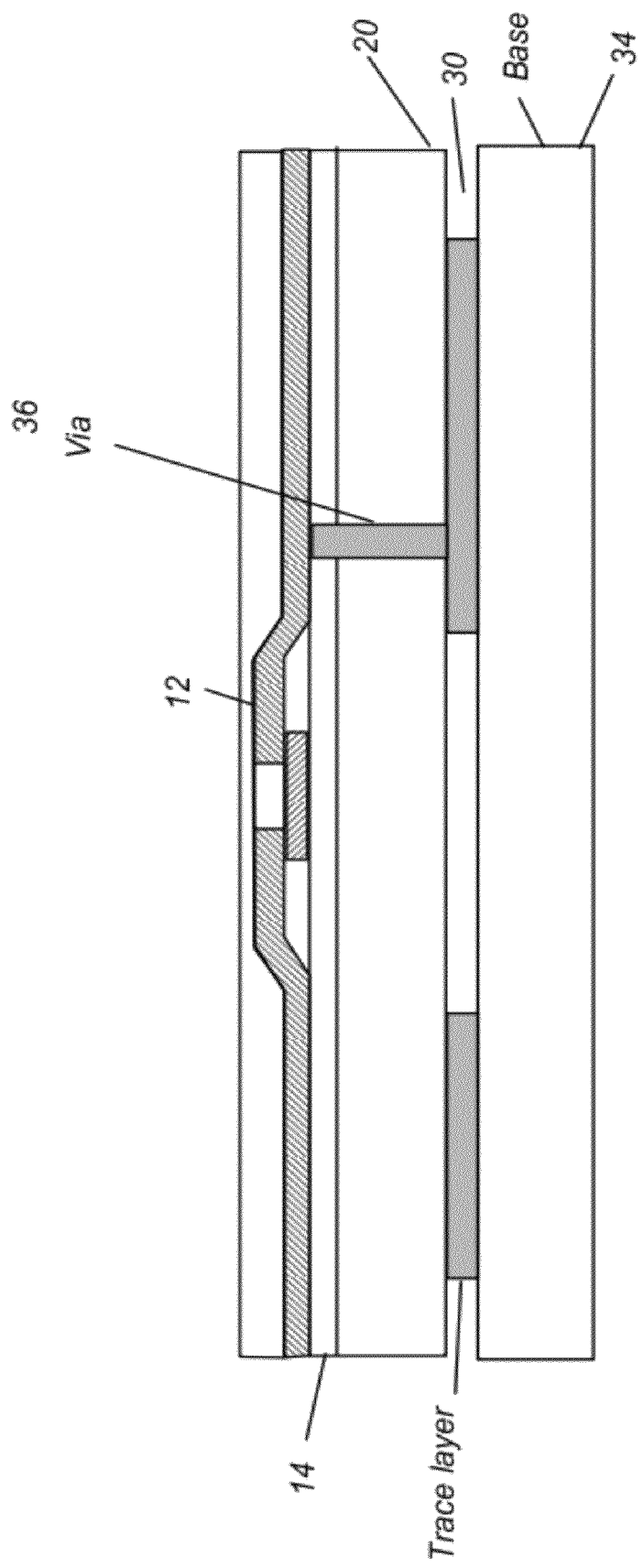

This next example considers additional steps that may be needed in order to formulate composite substrate 20. The basic steps are as follows:

1. Heat the plastic to its melt temperature Tg.
2. Add particulate material 16 to the melted plastic as a filler. For improved bonding, particulate material 16 works best if deposited on or near the surface of substrate 20. For improved CTE, however, a more general distribution of particles mixed throughout the plastic material is preferred. In most cases, it is preferred to have a thicker concentration of particulate material 16, or exposed portions of particulate material 16 near the surface of substrate 20. Thus, this step would require some mixing of particulate material 16 with the melted plastic binder.
3. Mounting on carrier 18. The flexible substrate is initially laminated onto a glass carrier 18, as is shown in FIG. 7A. This is done by positioning substrate 20 on carrier 18 and treating this combination by applying heat and pressure to achieve the flow temperature (Tg) of the PTFE material, approximately 300 degrees C. The PTFE material softens, reflows, and bonds to the surface of carrier 18.
4. Planarization. The desired surface roughness for TFT deposition can be on the order of less than 0.2 to 0.3 microns peak-to-peak in some applications. In order to achieve this, spun-on glass (SOG) is deposited as planarization layer 14, as shown in FIG. 7B. To apply this substance, a sol of colloidal silica particles in a solvent is applied to the substrate 20 surface. Temperature at 300-400 degrees C. is applied to cure the sol material, removing solvent and leaving a gel residue that, when itself heated, converts to an $SiO_2$ film having dielectric constant $\in$ between about 3 and 5 and providing the necessary insulation and planarization needed prior to TFT deposition. Alternative planarization materials are described subsequently.
5. Forming electrical isolation layer. As a final surface preparation step for conditioning the surface of the substrate, which may be optional, an electrical isolation layer is deposited on top of the planarization layer. A suitable isolation layer material can be SiO2, SiNx, SiON, or some combination of these materials. This is typically in the range from about 0.5 to 1.5 μm.
6. Forming TFT elements. Following preparation of the flexible substrate 20 surface, the lay-down of TFT elements can begin. This procedure uses processes that are well known in the art of component fabrication for lay-down of gate, source, and drain components and other supporting layers. As part of TFT fabrication, semiconductor material is deposited, then a pattern is formed by selectively removing portions of the semiconductor material. FIG. 7C shows thin-film component 12 formed as a result of this step.
7. Add protective layer 44. This optional step provides a protective coating for thin-film component 12, as shown in FIG. 7D.
8. Delamination from carrier 18. This may require application of heat at temperatures near the flow temperature of the substrate plastic material. This allows separation of substrate 20 from carrier 18. Once separated, substrate 20 can be laminated to some other surface or allowed to cool. Alternate delamination methods could also be employed.
9. Patterning of trace layer 30. As shown in FIG. 7E, trace layer 30 can now be etched to provide the desired pattern of traces for component interconnection. An optional filler 40 may also be added.
10. Addition of optional base layer 34. As shown in FIG. 7F, base layer 34 can be applied over trace layer 30. In one embodiment, base layer 34 is spun-on glass to provide a protective and insulating coating.
11. Form vias. As shown in FIG. 7G, one or more vias 36 can be formed to connect thin-film component 12 with interconnect traces on trace layer 30. Vias 36 can be drilled using conventional methods or can be formed using a laser.

Example 3

In another embodiment, substrate 20 is formed from polyimide or a polyimide composition and binder, using the following steps:
1. Coat uncured plastic binder material onto a suitable carrier. Here, partially cured polyimide is coated onto the carrier. Any suitable method of application can be used, including dip-skiving, spun-on application, or extrusion.
2. Cure the uncured plastic material until the curing process is largely completed.
3. When approximately 80% of the curing cycle is complete, add particulate material 16 onto the surface of substrate 20. Here, the particulate material 16 is sprinkled onto the surface, to provide an even coating.
4. Complete the curing process, baking off the remaining solvent.
5. Planarization. The desired surface roughness for TFT deposition can be on the order of less than 0.2 to 0.3 microns peak-to-peak in some applications. In order to achieve this, spun-on glass (SOG) is deposited. To apply this substance, a sol of colloidal silica particles in a solvent is applied to the substrate 20 surface. Temperature at 300-400 degrees C. is applied to cure the sol material, removing solvent and leaving a gel residue that, when itself heated, converts to an $SiO_2$ film having dielectric constant $\in$ between about 3 and 5 and providing the necessary insulation and planarization needed prior to TFT deposition. Alternative planarization materials are described subsequently. Planarization material could optionally be applied to the patterned metal traces, if needed.
6. Forming electrical isolation layer. As a final surface preparation step for conditioning the surface of the substrate, which may be optional, an electrical isolation layer is deposited on top of the planarization layer. A suitable isolation layer material can be SiO2, SiNx, SiON, or some combination of these materials. This is typically in the range from about 0.5 to 1.5 μm.
7. Forming TFT elements. Following preparation of the flexible substrate 20 surface, the lay-down of TFT elements can begin. This procedure uses processes that are well known in the art of component fabrication for lay-down of gate, source, and drain components and other supporting layers. As part of TFT fabrication, semiconductor material is deposited, then a pattern is formed by selectively removing portions of the semiconductor material.
8. Delamination from carrier 18. This may require application of heat at temperatures near the flow temperature of the substrate plastic material. This allows separation of substrate 20 from carrier 18. Once separated, substrate 20 can be laminated to some other surface or allowed to cool. Alternate delamination methods could also be employed.
9. Patterning of trace layer 30. As was shown in FIG. 7E, trace layer 30 can now be etched to provide the desired pattern of traces for component interconnection. An optional filler 40 may also be added, as noted earlier.
10. Addition of optional base layer 34. As was shown in FIG. 7F, base layer 34 can be applied over trace layer 30. In one embodiment, base layer 34 is spun-on glass to provide a protective and insulating coating.
11. Form vias. As was shown in FIG. 7G, one or more vias 36 can be formed to connect thin-film component 12 with interconnect traces on trace layer 30. Vias 36 can be drilled using conventional methods, with electroplating or insertion of rivets. Optionally, the via apertures can be formed using a laser.

In an alternative embodiment, particulate material 16 can be added to uncured plastic as a filler, with the CTE advantages described in Example 2.

TFT Deposition onto PC Board

Figure 8:
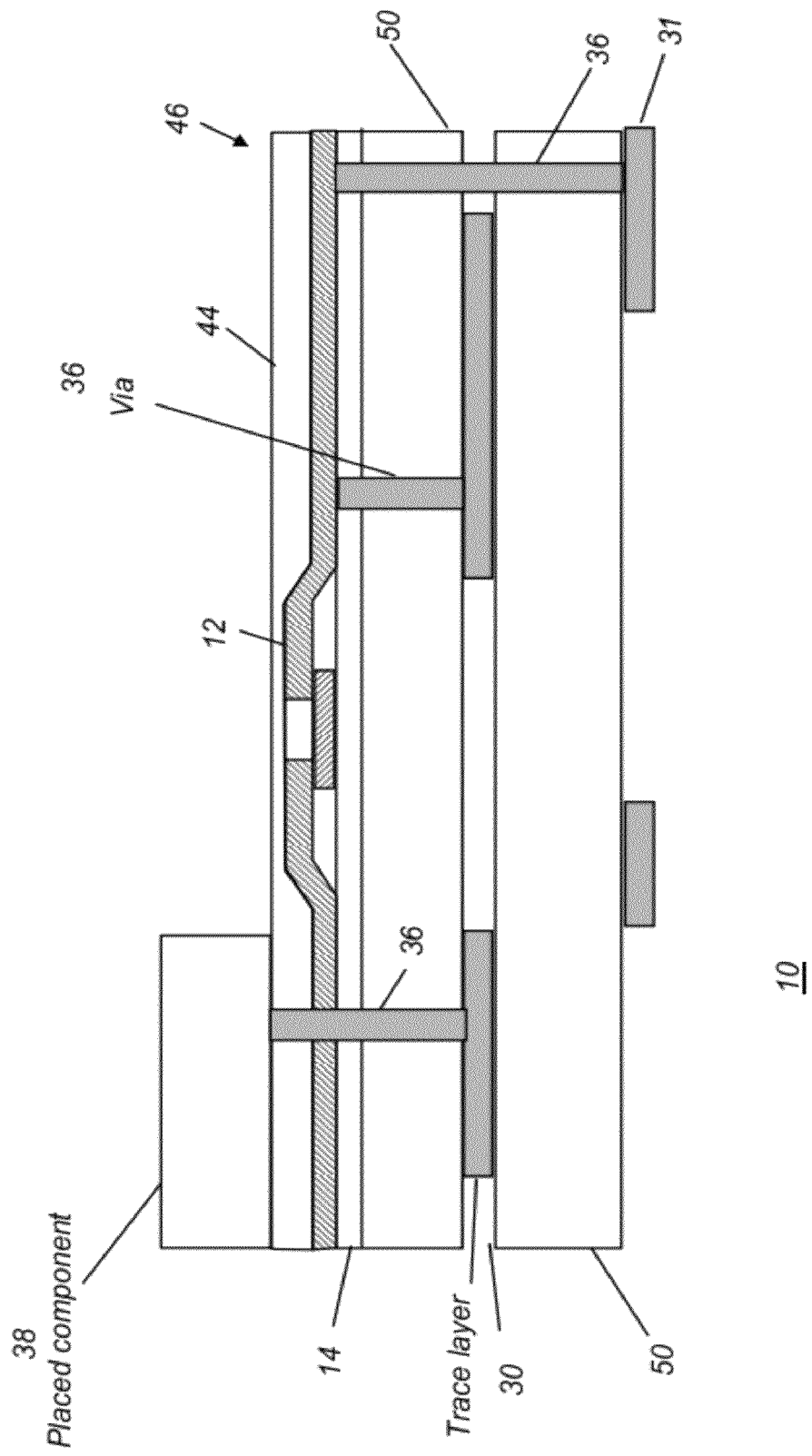
FIG. 8 is a cross-sectional view showing a circuit arrangement with TFT components formed on a PC board in one embodiment.

In another embodiment, as shown in the cross-section view of FIG. 8, thin-film component 12 is formed directly onto a PC board 46. Here, thin-film components are formed directly on the PC board 46 surface. Most PC boards are composed of more conductive layers separated and supported by layers of insulating substrate 50 that are laminated together, typically using some combination of heat and adhesive. The method of the present invention forms TFT devices directly onto the surface of a PC board formed from FR-4. This material is formed from a woven fiberglass mat that is impregnated with an epoxy resin.

In one embodiment, fabrication steps for TFT deposition onto PC board 46 are as follows:
1. Planarization. This step is carried out after the PC board is formed, with necessary patterned trace layers 30 and 31, etc. as is represented in FIG. 8. The desired surface roughness for TFT deposition can be on the order of less than 0.2 to 0.3 microns peak-to-peak in some applications. In order to achieve this, spun-on glass (SOG) is deposited onto substrate 50 as planarization layer 14, as shown in FIG. 8. To apply this substance, a sol of colloidal silica particles in a solvent is applied to the substrate 50 surface. Temperature at 300-400 degrees C. is applied to cure the sol material, removing solvent and leaving a gel residue that, when itself heated, converts to an $SiO_2$ film having dielectric constant $\in$ between about 3 and 5 and providing the necessary insulation and planarization needed prior to TFT deposition. Other suitable planarization materials could alternately be used.
2. Forming electrical isolation layer. As a final surface preparation step for conditioning the surface of PC board substrate 50, which may be optional, an electrical isolation layer is deposited on top of the planarization layer. A suitable isolation layer material can be SiO2, SiNx, SiON, or some combination of these materials. This is typically in the range from about 0.5 to 1.5 μm.
3. Forming TFT elements. Following preparation of the PC board substrate 50 surface, the lay-down of TFT elements can begin. This procedure uses processes that are well known in the art of component fabrication for lay-down of gate, source, and drain components and other supporting layers. As part of TFT fabrication, semiconductor material is deposited, then a pattern is formed by selectively removing portions of the semiconductor material.
4. Add protective layer 44. This optional step provides a protective coating for thin-film component 12, as shown in FIG. 8.
5. Form vias. As shown in FIG. 8, one or more vias 36 can be formed to connect thin-film component 12 with interconnect traces on trace layer 30. Vias 36 can be drilled using conventional methods or can be formed using a laser. Visible, blind and buried vias 36 may be provided with this embodiment.
6. Place other components. Once vias 36 are formed for connection to trace layers 30, 31, other semiconductor components 38 can be placed, including their placement in the near vicinity of thin-film components 12, as shown in the example of FIG. 8.

It is instructive to note that some of these fabrication steps could be rearranged. For example, where high heat processes are used, it may be advantageous to form vias (given as step 5 above) prior to forming TFT devices (step 3 above).

The combination of PCB layers and TFT layers allows some or all of the metal traces to be fabricated in the low-resistance, low-capacitance PCB and the semiconductor device to be fabricated in one or more TFT layers. The TFT layers are connected electrically to the PCB layers via connection between the semiconductor or metal layers in the TFT and the top metal layer in the PCB. Advantages of this combination include:

Lower resistance of the thick metallization used in PCB allows higher current, faster rise time, lower power dissipation ($I^2R$).

Lower capacitance between layers of the thick metallization used in PCB allows faster rise time, lower power dissipation due to charge and discharge of capacitance, lower capacitive coupling of signals between layers.

Greater number of layers in PCB allow more layers of routing of signals, power, and ground to facilitate complex circuits.

The thick metal layers in a PCB allow improved heat dissipation over that of a conventional TFT.

Improved power distribution over large areas due to the ability to fabricate multiple power and ground planes and the thick metallization in power and ground planes.

Lower cost of the device due to fabrication of metal layers and vias in the lower-cost PC board process.

One embodiment of the invention consists of a backplane for a display device in which one or more of the functions of row address, column address, data transmission to individual pixels, power planes, ground planes, and various timing and clock signals are implemented in printed circuit board layers and switching and display pixel driving functions are implemented in TFT layers. An example of this embodiment would consist of horizontal and vertical lines for timing, clocking and signal processing contained in the various printed circuit board layers. Vias from these layers to the top layer of the PC board would be provided at each pixel or group of pixels. Interconnect to the TFT devices would be provided by metal layers on the TFT or by fabrication of the semiconductor device directly on the top metal layer of the PC board.

Another embodiment of the invention consists of a backplane for an image sensing device in which one or more of the functions of row address, column address, data transmission to individual pixels, power planes, ground planes, and various timing and clock signals are implemented in the PC board layers and switching and display pixel driving functions are implemented in the TFT layers. An example of this embodiment would consist of horizontal and vertical lines for timing, clocking and signaling contained in the various PCB layers. Vias from these layers to the top layer of the PC board would be provided at each pixel or group of pixels. Interconnect to the TFT devices would be provided by metal layers on the TFT or by fabrication of the semiconductor device directly on the top metal layer of PC board 46.

Substrate 50 of printed circuit board 46 may be composed of a number of materials as alternatives to FR-4. Other materials having a suitably low dielectric constant and dissipation factor may include Rogers 4000 or Rogers Duroid from Rogers Corporation, Rogers, Conn. Teflon type GT or GX, polyimide, polystyrene, and cross-linked polystyrene, for example, could alternately be used for substrate 50.

Surface Treatment Methods

Conditioning of the surface of substrates 20 or 50 to improve bonding of layer 14 and other materials for thin-film device fabrication can be performed in a number of ways. As noted earlier, the method of the present invention works best when surfaces of the particulate material 16 are exposed on the surface of substrate 20, providing bonding surfaces thereby. Because of the nature of the plastic material used as binder in substrate 20, the surface of substrate 20 generally has a high proportion of resinous content, even when a filler of particulate material 16 has been used. Thus, exposure of particulate material 16 for improved bonding may require some method for removing some percentage of plastic material along the surface itself.

Figure 5:
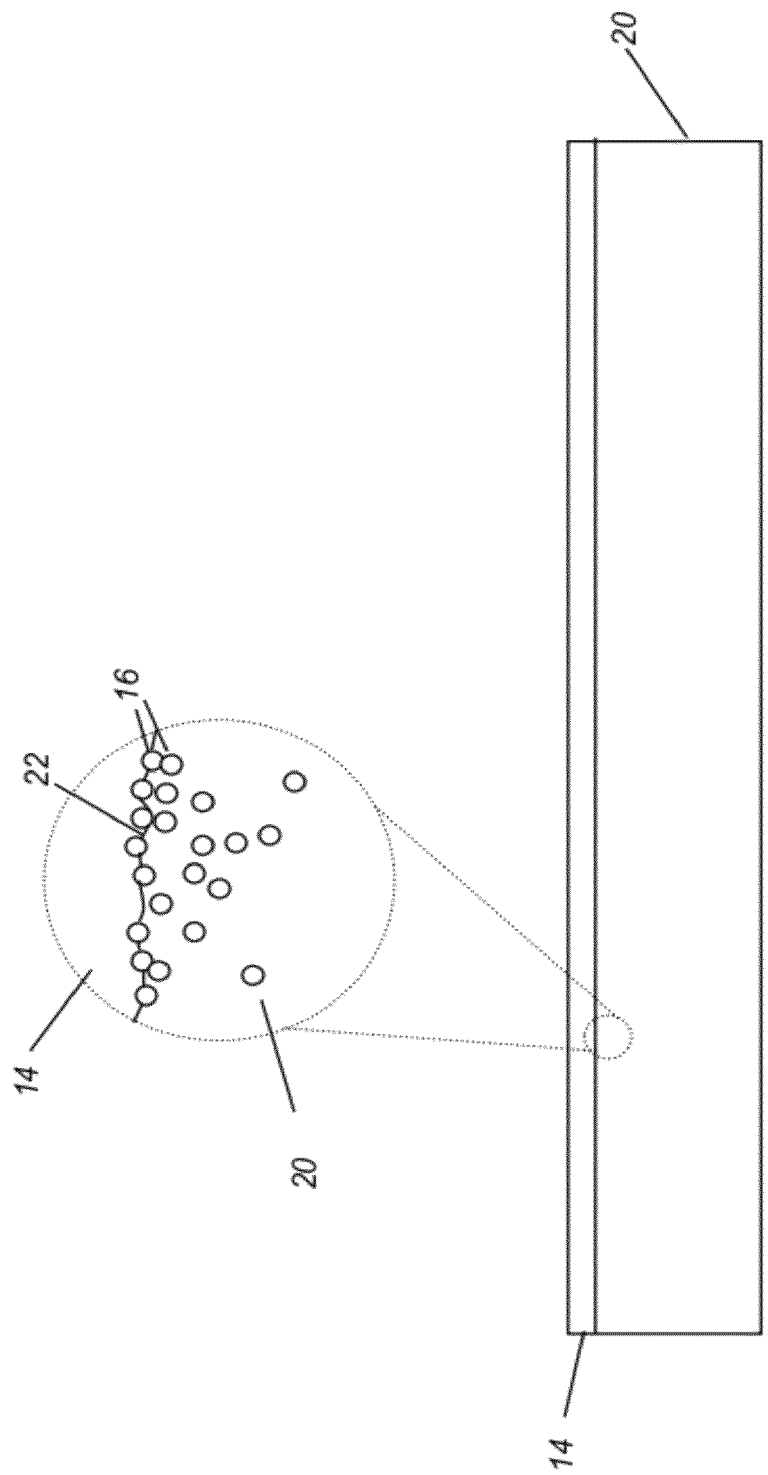
FIG. 5 is a cross-sectional view showing a magnified portion of the composite substrate following surface conditioning.

The magnified portion of FIG. 5 shows how a surface 22 can be featured when exposing particulate material 16. Methods for conditioning the surface in this way include the following:

Chemical removal, such as using etchant materials, including a number of suitable acids.

Plasma etching.

Corona discharge treatment.

Heat application.

Use of super-critical carbon-dioxide, $CO_2$.

Laser ablation.

Thermal decomposition in vacuum.

Application of these surface treatment methods for plastic binder material removal is familiar to those skilled in the surface treatment arts. Unlike the exemplary embodiment of FIGS. 4 and 5, in which particulate material 16 is added or embedded as a filler that is heavily concentrated on and near the surface of substrate 20, these surface treatment methods can be used when substrate 20 consists of a mixture of particulate material 16 that is more or less evenly mixed throughout as filler within the plastic binder. As was noted earlier, an inherent advantage to such a material is its improved CTE.

In another embodiment, the reflow advantages of PTFE are utilized to advantage for surface conditioning. Particulate material 16 can be dusted or sprinkled onto the heated surface of PTFE or a PTFE composition with another suitable material, at just above its glass transition temperature Tg. Allowing the PTFE material to cool then yields a surface conditioned for deposition of planarization or other layers. Some amount of treatment, using the conditioning methods just described, may be used to improve the surface of substrate 20 following the deposition of particulate material 16.

Figure 6:
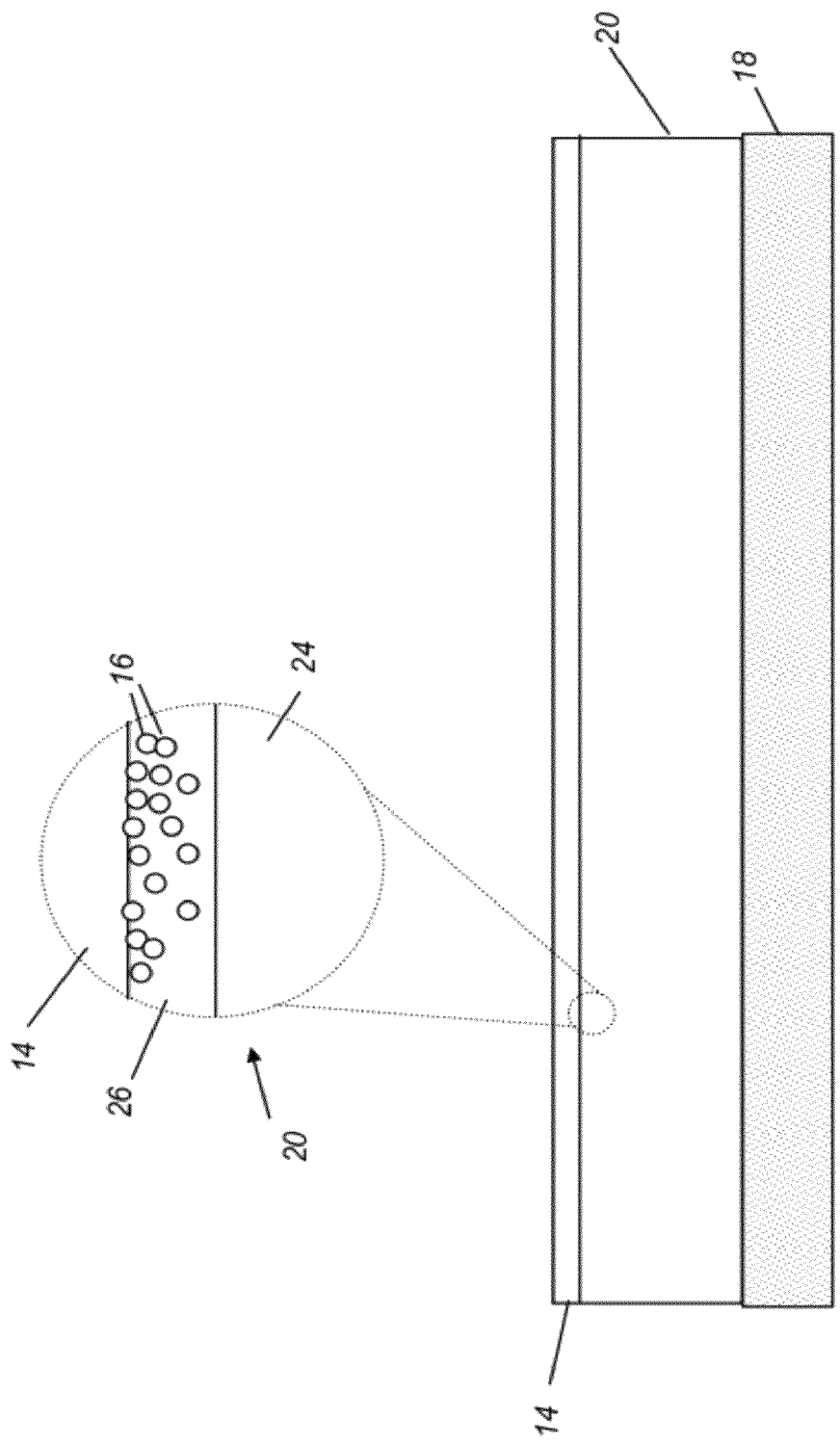
FIG. 6 is a cross-sectional view showing a magnified portion of a substrate having a composite layer atop a base layer in one embodiment.

In yet another embodiment, as shown in FIG. 6, a first plastic material is provided as a base substrate 24. Then, a composition 26 is coated onto the surface of this base substrate, where the composition includes one plastic binder material that is mixed with at least one particulate material 16. This process thus provides a surface that is suitably treated for depositing one or more layers, which may be, for example, planarization layer 14 as shown in FIG. 6, an isolation layer, or an electronically active semiconductor layer used to form some portion of a thin-film electronic device.

Planarization Materials

In addition to spun-on glass, the following planarization materials may be used in different embodiments:

Benzocyclobutene (BCB). This material must be semiconductor grade, without mobile ions.

Acrylic.

Tetraethoxysilane (TEOS).

Relative to other solutions that attempt to employ plastic substrates, the method of the present invention promotes improved adhesion of the TFT layers, since glass, ceramic, or other suitable particulate provides better adhesion than does the plastic binder alone. The use of particulate material 16 increases the temperature limits before loss of dimensional stability, allowing device fabrication at higher temperatures.

The method of the present invention is advantaged since it allows the formation of TFT components directly on a flexible substrate, without the need for intermediate steps such as lamination. This method can be particularly well-suited to web or roll-to-roll fabrication, in which a substrate sheet would be unwound from a first roll, undergo surface conditioning by embedding particulate material 16 as described earlier, and be further processed or rewound on a second roll for future use.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, a broad range of particulate substances of various types could be employed as particulate material 16 or a mixture of particulate materials used, taking advantage of favorable properties of multiple materials. Additional types of surface conditioning could be used at various points in the electronic device fabrication process, using tools such as plasma etching, as noted earlier. One or both sides of a sheet of substrate material can be treated using the method of the present invention. Various methods, including embossing, can be used for preparing the surface of substrate 20 prior to applying planarization layer 14 and TFT device formation. Components formed on substrate 20 or on planarization layer 14 can include optical components, including refractive components such as one or more lenses or lenslets. Lenslets could be spatially aligned with TFT components, to provide input or output pixel elements. Fabrication steps given in the example embodiments can be modified depending on process requirements or device characteristics. For example, in some embodiments, vias and traces are formed prior to formation of the TFT devices.

The electronic device formed on substrate 20 or 50 can be used to provide signals to or from any of a number of different types of components and would have particular applications for image display pixels or image sensing pixels. For example, the electronic device formed on the substrate 20 surface can be coupled with a corresponding liquid crystal pixel, light-emitting diode pixel, or organic light-emitting diode pixel for display, for example. For image sensing, the electronic device formed on the substrate 20 surface can be coupled with a stimulable phosphor pixel or with another type of sensor pixel, including a biological detector.

The use of vias 36 in the present invention offers other advantages for heat dissipation where thin-film components are used on a substrate. The use of thermal vias is described in more detail in commonly assigned U.S. Pat. No. 6,812,949 (Switzer et al.)

In some embodiments, the patterned metallic coating formed on one side of substrate 20 provides signal connection between components that form an electronic circuit. In other embodiments, the patterned metallic coating may be a ground plane or an electromagnetic interference (EMI) shield.

The present invention also relates to multi-layer substrates in which the bottom layer is optimized for properties related to the carrier (such as adhesive properties to the carrier), the top layer is optimized for properties related to the electronic device (such as adhesion to the device layers) and intervening layers are optimized to achieve selected properties, such as optical, electronic, thermal, magnetic or chemical properties.

Thus, what is provided is an apparatus and method for fabrication of an electronic device and interconnect traces on a substrate.

PARTS LIST

10 electronic device
12 thin-film component
14 layer
16 particulate material
18 carrier
20 substrate
22 surface
24 base substrate
26 composition
28 surface
30 trace layer
31 trace layer
34 base layer
36 via
38 component
40 filler
42 insulator
44 protective layer
46 PC board
50 substrate

The invention claimed is:

1. A method of manufacturing an electronic device comprising:
   a) providing a substrate that comprises at least one plastic material;
   b) forming a pattern on at least one surface of said substrate;
   c) embedding a non-doping particulate material at and below at least one surface of said substrate, wherein the embedded particles have high concentration at the surface and the concentration decreases with depth inside the substrate;
   d) applying a planarization material to the surface of the substrate having the embedded particulate material, forming a planarization layer thereby;
   e) forming a thin film electronic device on said surface with said particulate material; and
   f) forming a patterned trace layer on the surface of the substrate that lies opposite the surface having the embedded particulate material.

2. The method of claim 1 wherein forming a pattern comprises embossing.

3. The method of claim 1 wherein the pattern comprises one or more lens elements.

4. The method of claim 1 wherein the one or more lens elements are spatially aligned with the thin film electronic devices formed on said surface.

5. The method of claim 1 wherein the step of providing the substrate comprises unwinding the substrate from a roll.

6. The method of claim 5 further comprising re-winding the substrate having the electronic device formed thereon onto a roll.

7. The method of claim 1 further comprising coupling the electronic device formed on said surface with a liquid crystal pixel.

8. The method of claim 1 further comprising coupling the electronic device formed on said surface with a light-emitting diode pixel.

9. The method of claim 1 further comprising coupling the electronic device formed on said surface with an organic light-emitting diode pixel.

10. The method of claim 1 further comprising coupling the electronic device formed on said surface with a stimulable phosphor pixel.

11. The method of claim 1 further comprising coupling the electronic device formed on said surface with a sensor pixel.

* * * * *